United States Patent [19]

Conforti

[11] 4,139,846

[45] Feb. 13, 1979

[54] METHOD AND APPARATUS FOR SUPERVISING BATTERY ENERGY LEVEL

[75] Inventor: Frederick J. Conforti, Aurora, Ill.

[73] Assignee: Pittway Corporation, Northbrook, Ill.

[21] Appl. No.: 811,827

[22] Filed: Jun. 30, 1977

[51] Int. Cl.$^2$ ............... G08B 19/00; G08B 17/10
[52] U.S. Cl. ............................ 340/636; 340/629; 340/663
[58] Field of Search ............ 340/249, 237.5, 636, 340/629, 663; 320/48; 324/29.5

[56] References Cited

U.S. PATENT DOCUMENTS 3,899,732  8/1975  Staby ........................ 340/249 X
4,024,523  5/1977  Arnold et al. ................ 340/249

Primary Examiner—John W. Caldwell, Sr.
Assistant Examiner—Daniel Myer
Attorney, Agent, or Firm—Gary, Juettner & Pyle

[57] ABSTRACT

Apparatus for supervising the energy level of a battery is characterized by circuitry for periodically loading the battery, monitoring the change in voltage across the battery from the condition prior to loading to during loading, and generating a signal whenever the change in voltage is at least equal to a predetermined magnitude. In one embodiment the apparatus is used with a fire detector powered by the battery, and the signal operates an alarm to indicate impending battery failure.

31 Claims, 4 Drawing Figures

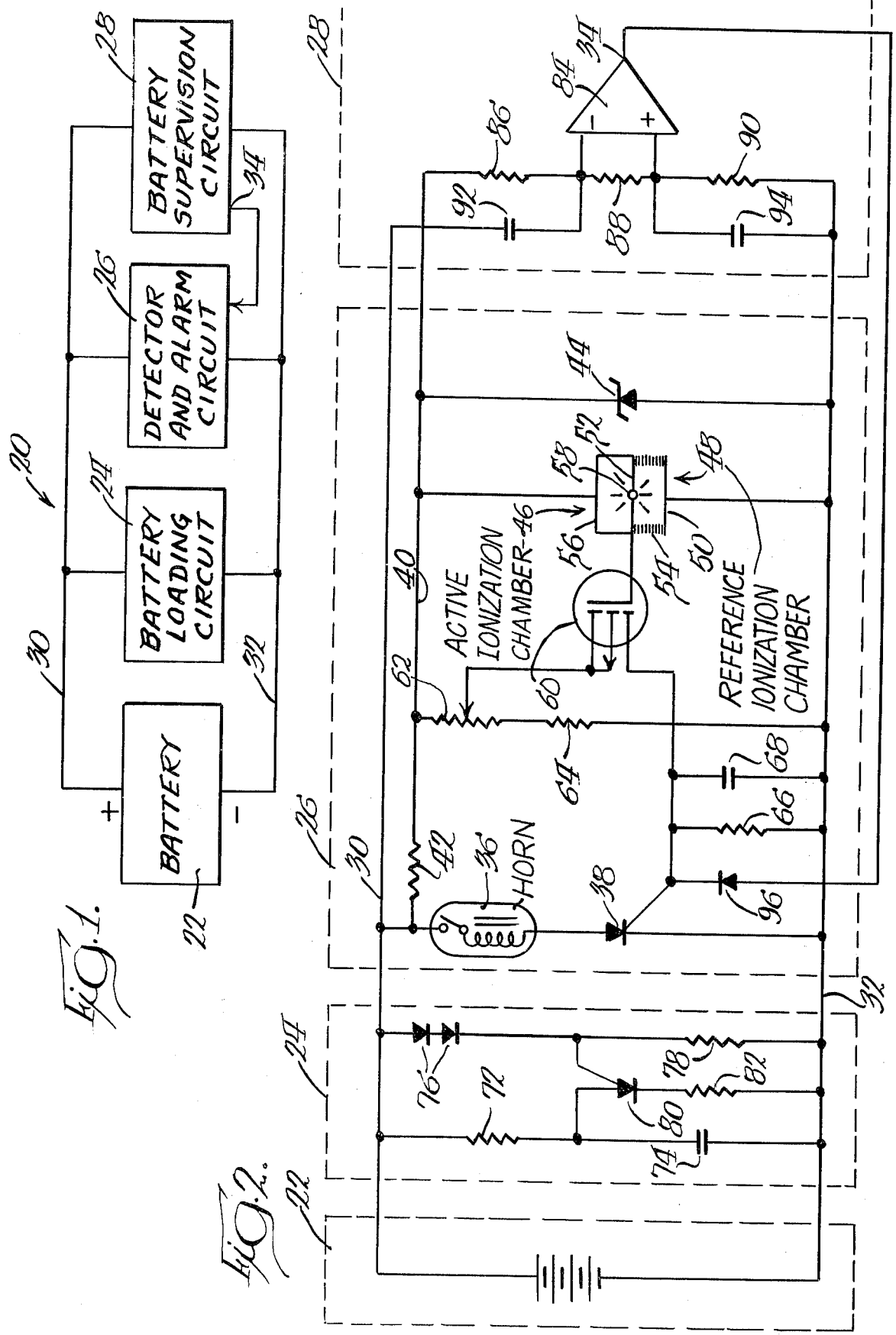

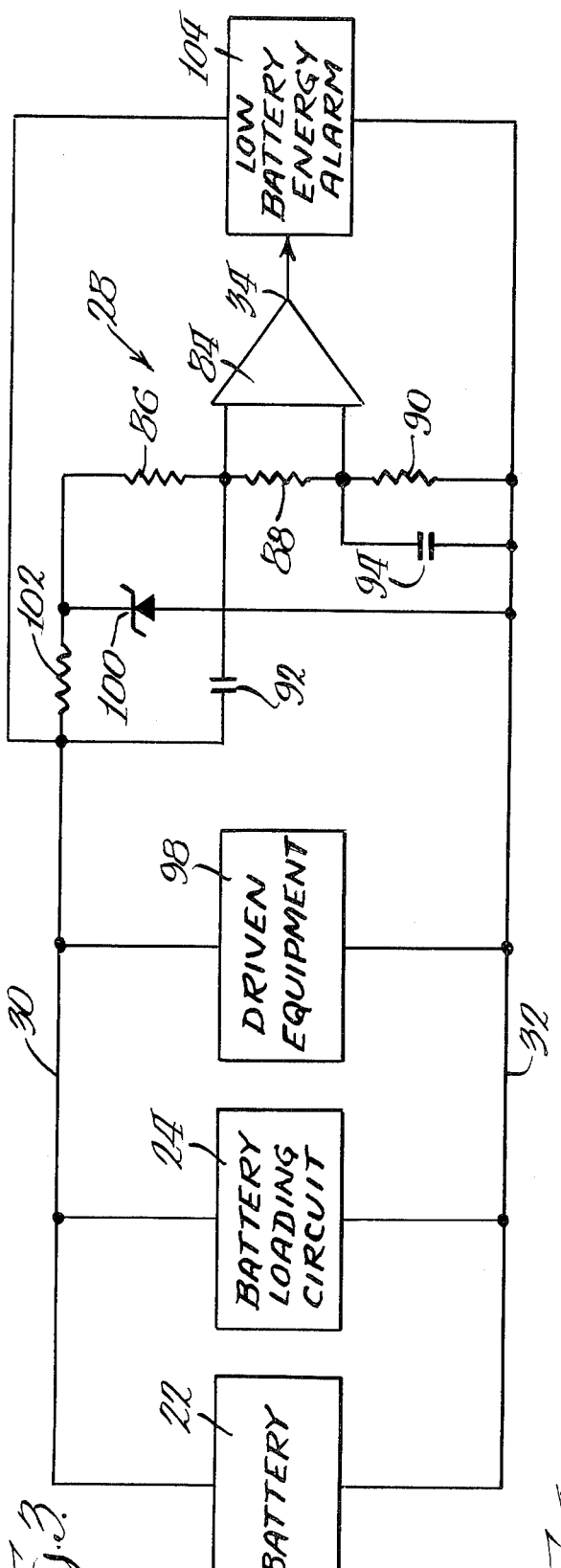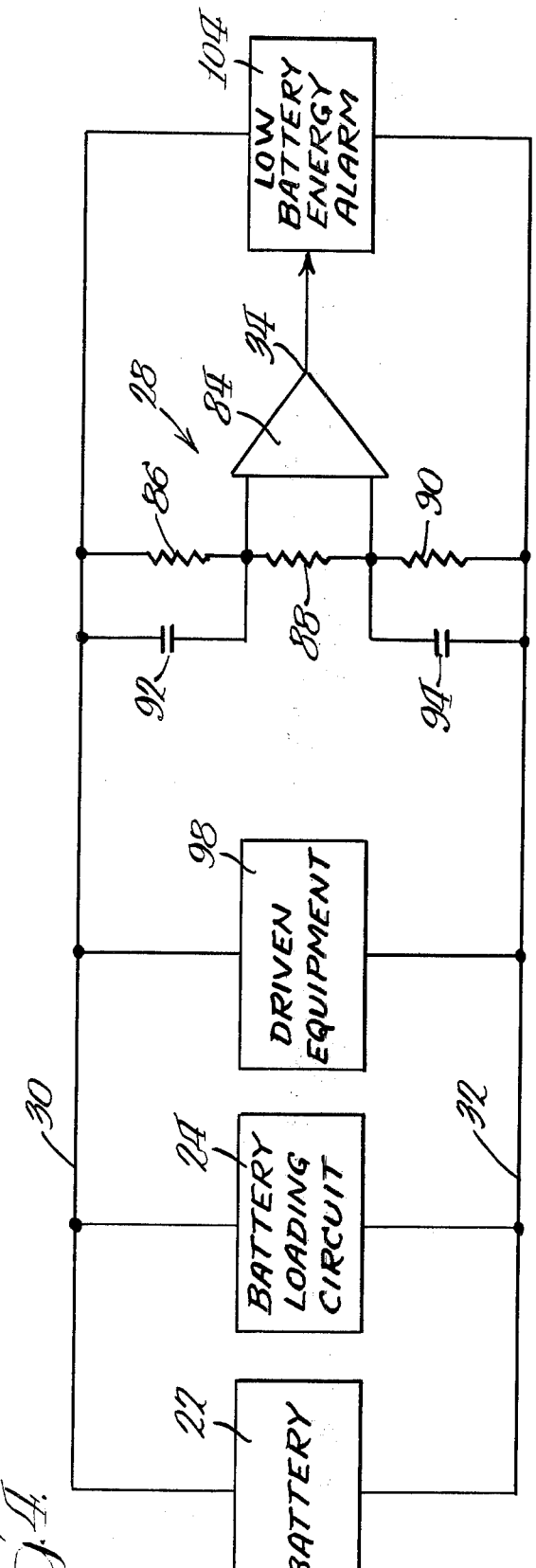

METHOD AND APPARATUS FOR SUPERVISING BATTERY ENERGY LEVEL

BACKGROUND OF THE INVENTION

The present invention relates to an apparatus for and a method of supervising the energy level of a battery, and in particular to such an apparatus and method for use with a device for detecting the occurrence of a predetermined condition.

Battery powered equipment is generally unreliable to the extent that the energy level of the battery ultimately will decrease below a level sufficient to properly operate the equipment. Where the equipment is, for example, a fire detector, allowing the energy level of the battery to decrease below a level sufficient to operate the detector not only is undesirable, but is intolerable, since such would result in the detector becoming inoperable and failing to generate an alarm upon the occurrence of combustion.

Merely instructing a user of a fire detector to replace the battery after a predetermined peiod of time is unsatisfactory, since it is likely that the instructions will either be forgotten or unheeded, ultimately resulting in failure of the detector. Further, due to variations between individual batteries which cause the lengths of their useful lives to vary considerably one from the other, it is possible that a battery may fail before the end of its expected useful life. Consequently, battery powered devices such as fire detectors should be provided with some means for warning users of impending battery failure.

A decrease in the energy level of a battery generally is evidenced both by a decreased battery output voltage and an increased battery internal resistance. A decrease in battery output voltage limits the power which the battery is capable of providing, and an increase in battery internal resistance limits the output current and, therefore, the power output of the battery.

One conventional technique for monitoring the energy level of a battery contemplates comparing the output voltage of the battery with a predetermined and lower voltage. The predetermined voltage is that level of battery voltage at which failure of the battery is expected to be impending, and upon the battery voltage reaching the predetermined level as the energy level in the battery decreases, an alarm is generated to indicate the need for replacement of the battery. A disadvantage of this technique is that prior to the battery output voltage decreasing to the predetermined value it is possible, due to variations in the battery, for the internal battery resistance to increase to a value at which the battery is incapable of properly powering the device in all of its modes. In the case of a fire detector the warning generated in response to combustion often comprises the sounding of a horn. Horns usually require relatively large currents for their operation, and it is possible that the internal resistance of the battery may, prior to its output voltage decreasing to the level sufficient to generate the warning, increase to a level whereat the battery will not be capable of operating the horn should combustion occur.

Another technique for monitoring the energy level of a battery is disclosed in U.S. Pat. No. 3,899,732 to Paul A. Staby, wherein the output voltage and the internal impedance of the battery is monitored and used as an indication of the energy level of the battery. In this case, the battery is periodically loaded, a first signal is generated which has a magnitude equal to a selected proportion less than 100% of the output voltage of the battery prior to loading, and a second signal is generated having a magnitude less than the first signal and equal to the output voltage of the battery when loaded less a predetermined voltage drop. The first and the second signals are compared, and a third signal is generated upon a predetermined difference therebetween. A disadvantage of the Staby circuit is that the first and the second signals follow naturally occurring decreases in battery voltage, with the second signal directly following the same and the first signal following only a proportion of the same, with the result that as the battery voltage decreases the sensitivity of the energy level detection is increased. This undesirably may result in premature generation of a signal of impending battery failure.

Accordingly, it is an object of the present invention to provide improved apparatus for and methods of supervising the energy level of a battery and providing a warning of impending battery failure.

Another object of the invention is to provide apparatus for and methods of monitoring the energy level of a battery and determining if the same exceeds a selected level.

Yet another object of the invention is to provide such apparatus and methods for providing an indication of impending battery failure only upon the internal impedance of the battery exceeding a predetermined value.

A further object of the invention is to provide such apparatus and methods, wherein the battery periodically is loaded and a warning of impending battery failure is generated only upon detection of a predetermined difference between the output voltages of the battery prior to loading and during loading.

A still further object of the invention is to provide such apparatus and methods, wherein the sensitivity of the supervising apparatus is substantially independent of naturally occurring decreases in battery voltage prior to loading.

SUMMARY OF THE INVENTION

In accordance with the present invention, a circuit for supervising the energy level of a battery periodically loads for battery, monitors the magnitude of the change in voltage across the battery from the condition prior to loading to during loading, and generates an indication whenever the magnitude of change is at least equal to a predetermined value, with the magnitude of change being at least equal to the predetermined value only when the energy level of the battery decreases below a selected level.

More particularly, the circuit includes means for periodically loading the battery to momentarily subject it to an increased current flow, means for generating a first voltage signal, and means for generating a second voltage signal having a magnitude substantially equal to the difference in output voltage of the battery from the condition prior to loading to during the loaded condition. Means are provided for comparing the magnitudes of the first and second signals and for generating a third voltage signal whenever their difference in magnitudes is at least equal to the predetermined value, which occurs whenever the energy level of the battery decreases below a selected level.

The first signal has a selected magnitude prior to loading of the battery, and the second signal is connected with the means for generating the first signal for decreasing the magnitude of the first signal by the magnitude of the second signal. The means for comparing monitors the magnitude of the first signal, and generates the third signal whenever the magnitude thereof is decreased to at least zero. An alarm is connected to receive the third signal, and generates an indication upon the occurrence thereof.

In a preferred embodiment the means for generating the first signal includes a voltage divider for being connected in circuit across the output of the battery, and means for applying a regulated voltage across the divider. The first signal is generated between first and second points along the voltage divider, and the means for generating the second signal includes circuit means for being connected between one output of the battery and the first point for applying the second signal thereto. The means for comparing monitors the magnitude of the voltage between the first and the second points, and means are provided for maintaining the voltage at the second point substantially constant during loading of the battery. In this manner, upon loading of the battery the circuit means applies the second signal to the first point to decrease the voltage thereat substantially by the magnitude of the second signal, and the means for comparing generates the third signal whenever the change in magnitude of the voltage at the first point during loading is at least equal to the magnitude of the voltage between the first and second points prior to loading.

In accordance with another embodiment, the battery supervising circuit is combined with a battery powered detecting device for detecting the occurrence of predetermined phenomena, which generates a distinct voltage signal upon the occurrence of the phenomena. The distinct signal is applied to the alarm, which in this case is operative to generate sensually discernible indications representative of either the occurrence of the predetermined condition or of the energy level of the battery decreasing to at least the selected level.

In accordance with a method of monitoring the energy level of a battery, the steps are provided of periodically loading the battery to subject it to a momentarily increased current flow, monitoring the change in voltage across the battery from the condition prior to loading to during loading, and generating a signal whenever the change in voltage is at least equal to a predetermined magnitude, the change being at least equal to the predetermined magnitude only whenever the energy level of the battery decreases to a selected level. Preferably, a first voltage signal is generated, and a second voltage signal having a magnitude substantially equal to the magnitude of the change in output voltage of the battery from the condition prior to loading to the condition during loading is also generated. The magnitudes of the first and second signals are compared, and a third signal is generated whenever their difference in magnitudes is at least equal to a predetermined value, the difference being at least equal to the predetermined value whenever the energy level of the battery decreases to at least the selected level.

In accordance with another method of the invention, the second signal is added to the first signal to change the magnitude of the first signal by the magnitude of the second signal, and the magnitude of the first signal is sensed and the third signal is generated whenever the magnitude of the first signal has been changed by at least a predetermined amount. A sensible indication is then generated in response to the third signal.

The invention thus provides improved circuits for and methods of supervising the energy level of a battery, which advantageously may be combined with a battery operated device for detecting the occurrence of predetermined phenomena.

Other objects, advantages and features of the invention will become apparent from a consideration of the following detailed description, when taken in conjunction with the accompanying drawings.

BRIEF DESCRIPTION OF THE DRAWINGS

FIG. 1 is a block diagram of a battery powered and supervised apparatus for detecting a selected condition;

FIG. 2 is a schematic illustration of the apparatus of FIG. 1, showing a battery supervision circuit in accordance with one embodiment of the invention;

FIG. 3 illustrates partly in block diagram and partly in schematic form a battery powered apparatus having a battery supervision circuit in accordance with another embodiment of the invention, and FIG. 4 illustrates partly in block diagram and partly in schematic form a battery powered apparatus having a battery supervision circuit in accordance with a further embodiment of the invention.

DETAILED DESCRIPTION

Referring to FIG. 1, there is shown and indicated generally at 20 a battery powered detecting apparatus having battery supervision. The apparatus includes a battery 22, a battery loading circuit 24, a detector and alarm circuit 26 and a battery supervision circuit 28. The battery provides power to the circuits 24, 26 and 28 by means of a pair of conductors 30 and 32, and an output 34 of the battery supervision circuit is connected with the detector and alarm circuit for causing an alarm to be generated thereby upon the energy level of the battery decreasing to a predetermined or selected level, as will be described.

In FIG. 2 there is a schematic illustration of one embodiment of the apparatus of FIG. 1. Considering first the detector and alarm circuit 26, the same includes a battery powered horn 36 and an SCR 38 in series between the conductors 30 and 32, and a conductor 40 which receives a voltage from the conductor 30 through a resistor 42. Means are provided, such as a zener diode 44, for regulating the voltage between the conductors 32 and 40 to a predetermined value.

Where the detector is a fire detector, the phenomenon to be detected is combustion, and a combustion sensing portion of the detector advantageously includes a sensor, shown as an active ionization chamber 46, in series with a reference impedance, shown as a reference ionization chamber 48, both chambers being connected in series between the conductors 32 and 40. The reference chamber includes conductive electrodes 50 and 52 which are maintained in a spaced relationship by a spacer 54 of insulating material, the electrodes and the spacer together forming a relatively imperforate enclosure. The active chamber includes a relatively open conductive housing 56 forming one electrode thereof in a spaced relationship with the electrode 52, the electrode 52 forming the other electrode of the active chamber and being common to both the active and the reference chambers. Means are provided, such as a radioactive source 58 positioned within a passage through the electrode 52, for ionizing air molecules within both of the chambers, whereby with a voltage applied across the electrodes 50 and 56 an electric field is generated within each chamber to establish a current flow therethrough by movement of the ions between the electrodes. The active and the reference chambers thus form a voltage divider circuit, with the voltage at the electrode 52 being substantially in accordance with the relative impedances of the chambers. In the alternative, the active and the reference chambers could be physically distinct ionization chambers connected in series without a common electrode therebetween, in which case the juncture between the chambers still would exhibit a voltage in accordance with the relative impedances of the chambers.

Changes in ambient conditions affect the ion current flow through the chambers, and therefore the impedances thereof. Naturally occurring changes in ambient conditions, such as changes in barometric pressure, temperature and relative humidity, occur slowly, the relatively closed reference chamber responds (changes its impedance) to these changes substantially simultaneously with and in proportion with the active chamber, and the voltage at the electrode 52 remains essentially constant. The reference chamber thus compensates the active chamber for slow changes in ambient conditions. For relatively rapid changed in ambient conditions, as occur with combustion, products of combustion concentrate in the relatively open active chamber much more rapidly than in the reference chamber. The products of combustion have a greater mass than air molecules, and upon entry into the active chamber they combine with the ionized air molecules therein to effectively reduce the current flow through the chamber in accordance with their concentrations. The reduced current flow increases the impedance of the chamber and, with the circuit connections shown, causes a decease in the voltage at the electrode 52. A predetermined change in the voltage at the electrode 52 may, then, be used as an indication of the occurrence of combustion.

Means for monitoring the voltage at the electrode 52 and for generating an indication upon a predetermined change in the value thereof includes a field effect transistor (FET) 60 connected at its gate with the electrode. A potentiometer 62 and a resistor 64 are connected in series between the conductors 32 and 40, and the drain-source circuit path of the FET is connected in series with a resistor 66 between a slider for the potentiometer and the conductor 32. The potentiometer setting establishes a reference voltage for the FET, and adjusts the sensitivity of the detector to products of combustion. For a given potentiometer setting the conductivity of the FET, and therefore the current flow therethrough and the voltage across the resistor 66, is determined by the voltage at the electrode 52, with a decrease in the value of the electrode voltage causing an increase in the conductivity of the FET, and therefore an increase in the voltage across the resistor 66. The SCR 38 is connected at its gate to sense the voltage drop across the resistor 66 for being triggered into conduction thereby, and a capacitor 68 prevents false triggering of the SCR.

Under ambient conditions in the absence of products of combustion, the electrode 52 is substantially at a nominal or first potential, and the potentiometer 62 is adjustable to control the current flow through the FET so that the voltage drop across the resistor 66 is less than sufficient to render the SCR conductive, whereby the horn is not sounded. Upon the occurrence of combustion, the relatively rapid increase in impedance of the active chamber with respect to that of the reference chamber causes a decrease in the voltage at the electrode 52 to at least a second potential to increase the conductivity of the FET, and therefore the voltage drop across the resistor 66, sufficiently to trigger the SCR into conduction. This energizes the horn to sound an alarm. The alarm continues until the active chamber is cleared of products of combustion to decrease the voltage across the resistor 66 to below the SCR trigger voltage, and the SCR then becomes nonconductive upon the next opening of the horn contacts.

Since the detector and alarm circuit 26 is powered by the battery 22, upon a sufficient decrease in the energy level of the battery the circuit will be rendered inoperative to respond to products of combustion. To warn of an impending failure of the battery, the invention provides an improved means for monitoring the energy level of the battery and for causing a warning to be generated when the energy level decreases to a predetermined selected level.

The means for monitoring the energy level of the battery includes the battery loading circuit 24 and the battery supervision circuit 28. The battery loading circuit 24 may comprise, by way of example, a resistor 72 and a capacitor 74 connected in series between the conductors 30 and 32, a pair of diodes 76 and a resistor 78 connected in series between the conductors, and a programmable unijunction transistor (PUT) 80 connected at its cathode with the conductor 32 through a resistor 82. The anode of the PUT receives an integrated voltage from the juncture of the resistor 72 and the capacitor 74, and the gate of the PUT is provided with a bias voltage from the juncture between the diodes 76 and the resistor 78. The circuit operates as a free running oscillator at a suitable frequency determined by the value of the components thereof.

In the operation of the battery loading circuit, the PUT is rendered conductive whenever the capacitor 74, which provides a voltage to the anode thereof, charges to a voltage sufficient to exceed the intrinsic standoff voltage between the anode and the gate electrodes of the PUT, which customarily is on the order of 0.6 volts. When this occurs, the gate of the PUT is pulled toward the potential on the conductor 32, whereby a relatively low impedance circuit is established across the battery output terminals through the diodes 76, the gate-cathode circuit of the PUT, and the resistor 82 to momentarily load and increase the current flow through the battery. Upon a decrease in the voltage at the anode of the PUT with discharge of the capacitor 74, sufficient current is then provided to the gate of the PUT through the diodes 76 to unlatch the PUT from its conductive state, whereby the above described cycle of operation is repeated and the oscillator recycles.

Every time the battery is loaded by the circuit 24, its output voltage decreases. This occurs because of the internal resistance of the battery which, with an increased current flow therethrough, causes a voltage drop within the battery which is reflected by a decrease in the output voltage thereof. The internal resistance of the battery increases with exhaustion of the battery or a decrease in its energy level, and advantageously may be used to provide an indication of the energy level of the battery. In other words, the net change or decrease in the output voltage of the battery when a load is placed thereon provides an indication of the remaining energy level of the battery, with greater changes in the output voltage indicating decreased energy levels.

Assume, for example, that upon an increase in the internal resistance of the battery to, say, 10 ohms, the energy level of the battery has decreased to a predetermined level which requires replacement of the battery. If a load causing an increased battery current flow of approximately a 10 milliampere were intermittently placed on the battery, for energy levels of the battery above the predetermined level the change in the output voltage of the battery from the condition prior to loading to during loading would be less than 0.1 volts. With decreasing energy levels of the battery, however, its internal impedance increases, and the 10 milliampere drain on the battery would provide for increasing magnitude changes in its output voltage whenever the battery was loaded, so that when the energy level of the battery decreased to the predetermined level and the internal impedance increased to 10 ohms, the output voltage of the battery in response to loading would change by 0.1 volts. Consequently, by monitoring the net change in the output voltage of the battery in response to loading, it may be determined that the energy level of the battery has fallen to at least the predetermined level whenever the change in output voltage is at least equal to 0.1 volts.

The battery supervision circuit 28 monitors or detects the net change in the output voltage of the battery every time that the same is loaded, and provides a signal whenever the net change in battery voltage from the condition prior to loading to during loading is at least equal to a selected value representative of the energy level of the battery decreasing to at least a selected level. In accordance with one embodiment of the invention, and as shown in FIG. 2, the battery supervision circuit includes an operational amplifier (OP AMP) 84 and three resistors 86, 88 and 90 connected in series between the conductors 32 and 40 for receiving the regulated voltage thereacross. A capacitor 92 is connected between the conductor 30 and the juncture of the resistors 86 and 88, which juncture also is connected with the inverting input to the OP AMP, and a capacitor 94 is connected between the conductor 32 and the juncture between the resistors 88 and 90, which juncture is connected with the noninverting input to the OP AMP.

The resistors 86, 88 and 90 are selected to develop across the resistor 88, and therefore across the inputs to the OP AMP, a voltage substantially equal to the net change in output voltage of the battery 22 when the battery is loaded by the circuit 24 upon the energy level of the battery decreasing to the predetermined level. Thus, for the circumstance where a 10 milliampere drain were intermittently placed on the battery to detect an internal battery resistance of 10 ohms, the resistors would be selected to develop 0.1 volts across the resistor 88. The arrangement is such that for unloaded conditions of the battery the voltage at the inverting input to the OP AMP is positive with respect to that at the noninverting input, so that the OP AMP provides at its output 34 a negative voltage. The output of the OP AMP is connected with the cathode of a diode 96, the anode of which connects with the gate of the SCR 38. With a negative signal at the output of the OP AMP, the diode 96 blocks the same from the gate of the SCR and the FET 60.

Since the capacitor 92 is connected directly with the positive output terminal of the battery via the conductor 30, each time the battery is loaded by the circuit 24 the net voltage drop thereacross is coupled through the capacitor and appears fully on one side of the resistor 88 and at the inverting input to the OP AMP. The instantaneous voltage on the other side of the resistor and at the noninverting input to the OP AMP does not change, however, since the capacitor 94 substantially retains its charge during loading of the battery. Consequently, upon loading of the battery a voltage signal having a magnitude equal to the net change in battery voltage is applied through the capacitor, and is added to and changes the magnitude of the voltage across the resistor 88 by the magnitude of the change in battery voltage. For the circuit connections and polarities shown, the magnitude of the voltage across the resistor is decreased or cancelled by the magnitude of the signal applied through the capacitor.

The OP AMP compares the signal applied through the capacitor 92 with that across the resistor 88 prior to loading. Put another way, the OP AMP compares the voltages on opposite sides of the resistor 88 or monitors the voltage thereacross. For net changes in the output voltage of the battery in response to loading, less than the magnitude of the voltage across the resistor 88 prior to loading, the inverting input to the OP AMP remains positive with respect to the noninverting input thereof, and the output therefrom is negative. Thus, whenever the energy level of the battery is above the selected level, the inverting input to the OP AMP always remains positive with respect to the noninverting input both before and during loading of the battery.

Upon the energy level of the battery decreasing to the selected level, and therefore the internal resistance of the battery increasing to the value representative of the selected energy level, loading of the battery causes the voltage at the inverting input to the OP AMP to decrease sufficiently with respect to the voltage at the noninverting input to provide at the output 34 from the OP AMP a positive voltage. The OP AMP thus compares the magnitude of the change in output voltage of the battery with the magnitude of the voltage across the resistor 88, and provides the positive output whenever at least a predetermined difference exists therebetween, which for the circuit shown is approximately zero. Considered another way, the OP AMP monitors the magnitude of the voltage across the resistor, and provides the positive voltage output when the same is approximately zero or less.

The positive output from the OP AMP is applied through the diode 96 to the gate of the SCR 38 to render the SCR conductive and to sound the horn 36. The horn continues to sound for the relative short period during which the battery is loaded, whereafter the output from the OP AMP again becomes negative and removes the trigger signal from the gate of the SCR. The SCR then stops conducting with the next opening of the horn contacts. In practice the net result is that a very short duration sound is emitted by the horn, which for practical purposes may be a single "click" of the horn, each and every time the battery is loaded and until the battery is replaced with a fresh battery.

The invention thus provides a unique circuit for accurately monitoring the energy level of a battery as a function of the internal resistance thereof. The warning generated by the alarm in response to a low battery energy level is a very short duration audible alarm, as compared with the continuous alarm sounded in response to the occurrence of combustion, whereby the signals are quite sensually different and a user of the device is readily apprised of the particular significance of the alarm.

FIG. 3 illustrates an alternate arrangement of the battery supervision circuit 28 and an apparatus for use therewith. The circuit monitors the energy level of the battery which normally drives equipment 98, which in this case may or may not be a fire detector. The battery supervision circuit is similar to that shown in FIG. 2, except that here the circuit does not rely upon another circuit for a supply of regulated voltage, but rather includes a zener diode 100 and a resistor 102 for providing a regulated voltage across the resistors 86, 88 and 90. An alarm 104, which may include a horn or other indicator in series with an SCR between the conductors 30 and 32, is connected with the output from the OP AMP for being actuated in response to the energy level of the battery decreasing to the selected level.

The arrangement of the battery supervision circuit 28 shown in FIG. 4 is similar to that in FIG. 3, except that the circuit does not operate with a regulated voltage across the resistors 86, 88 and 90. This circuit has the disadvantage that the voltage across the resistor 88 is proportional to battery voltage prior to loading, and therefore decreases with decreases in the voltage across the battery as the energy level thereof is exhausted. However, since the magnitude of the voltage coupled through the capacitor 92 upon loading of the battery is not affected by the value of the battery voltage prior to loading, the gradual change in voltage across the resistor 88 does not unreasonably affect the sensitivity of the supervising circuit, and the same may readily be used in situations where less than absolutely precise determinations of battery energy level are acceptable.

The invention thus provides improved battery supervision circuits and methods of operating the same, which accurately and reliably monitor the energy level of a battery and provide a signal or warning of impending battery failure as evidenced by an increase in the internal resistance of the battery. The supervision circuits are particularly useful with battery operated appliances such as fire detectors, and the components of the circuit readily may be selected to impose a minimum current drain on the battery to greatly prolong the life thereof. Further, where the circuit is used with a fire detector, the same alarm device which provides a warning of combustion may also be used to provide a sensually discernible signal for low battery energy levels.

While embodiments of the invention have been described in detail, it is understood that other embodiments and various modifications thereof may be devised by one skilled in the art without departing from the spirit and scope of the invention, as defined in the claims.

What is claimed is:

1. In a circuit for supervising the energy level of a battery, means for periodically loading the battery to subject the battery to a momentarily increased current flow, means for monitoring the change in voltage across the battery from the condition prior to loading to during loading, and means for generating a signal whenever the change in voltage is at least equal to a predetermined magnitude, the change in voltage being equal to at least the predetermined magnitude only whenever the energy level of the battery decreases to at least a selected level.

2. In a circuit for supervising the energy level of a battery, means for periodically loading the battery to subject it to a momentarily increased current flow; means for generating a first voltage signal, and means for comparing the magnitude of said first signal with the magnitude of the change in the output voltage of the battery from the condition prior to loading to during loading and for generating a second voltage signal whenever the magnitude of the battery voltage change is at least equal to the magnitude of said first signal, the magnitude of the battery voltage change being at least equal to the magnitude of said first signal only whenever the energy level of the battery decreases to at least a selected level.

3. In a circuit as in claim 2, including alarm means connected to receive said second signal and to generate an indication upon the occurrence thereof.

4. In a circuit as in claim 2, said means for comparing and generating including means for decreasing the magnitude of said first signal by the magnitude of change in the output voltage of the battery upon loading thereof, and means for detecting the magnitude of said first signal and for generating said second signal upon the magnitude of said first signal decreasing to at least zero.

5. In a circuit as in claim 2, said means for comparing and generating including means connected with said means for generating said first signal for applying the change in the battery output voltage thereto for cancelling the magnitude of said first signal by the magnitude of the change, and means for monitoring said first signal and for generating said second signal upon the magnitude thereof being cancelled to at least zero.

6. In a circuit for supervising the energy level of a battery, means for periodically loading the battery to momentarily subject it to an increased current flow; means for generating a first voltage signal; means for generating a second voltage signal having a magnitude substantially equal to the difference in output voltage of the battery from the condition prior to loading to during loading, and means for comparing the magnitudes of said first and second signals and for generating a third voltage signal whenever their difference in magnitudes is at least equal to a predetermined value, said difference in magnitudes being at least equal to said predetermined value only whenever the energy level of the battery decreases below a selected level.

7. In a circuit as in claim 6, said difference in magnitudes between said first and second voltage siganls being at least equal to said predetermined value whenever the magnitude of said second voltage signal is at least equal to the magnitude of said first voltage signal.

8. In a circuit as in claim 7, including means for regulating said first signal to a selected magnitude prior to loading of the battery, and circuit means for connecting said means for generating said second signal with said means for generating said first signal to decrease the magnitude of said first signal by the magnitude of said second signal, said means for comparing and generating comprising means for monitoring the magnitude of said first signal and for generating said third signal whenever the magnitude of said first signal is decreased to at least zero.

9. In a circuit as in claim 7, including alarm means connected with said means for comparing and generating for providing an indication upon the occurrence of said third signal.

10. In a circuit as in claim 7, said means for periodically loading the battery comprising an oscillator circuit for being connected across the battery output.

11. In a circuit as in claim 7, said means for generating said first signal including a voltage divider for being connected in circuit with said battery.

12. In a circuit as in claim 11, said first signal being generated between first and second points along said voltage divider, said means for generating said second signal including circuit means for being connected in circuit between one output of the battery and said first point for applying said second signal thereto and for changing the voltage thereat by the magnitude of said second signal, said means for comparing and generating being connected to monitor the magnitude of said first signal between said first and second points, and including means for maintaining the voltage at said second point substantially constant during loading of the battery, so that upon loading of the battery said circuit means applies said second signal to said first point to change the magnitude of the voltage thereat and therefore the magnitude of said first signal, said means for comparing and generating providing said third signal whenever said change in magnitude of said signal during loading is at least equal to the magnitude of the said first signal prior to loading.

13. In a circuit as in claim 12, said circuit means comprising a capacitor for being connected between the one battery output and said one point.

14. In a circuit as in claim 12, said second signal being of a polarity to change the magnitude of the voltage at said first point in a direction to decrease the magnitude of said first voltage signal between said first and second points, said means for comparing and generating being responsive to provide said third signal whenever the magnitude of the voltage between said first and second points is decreased to at least zero.

15. In a circuit as in claim 14, said means for comparing and generating comprising an operational amplifier connected at one of its inputs with said first point and at another of its inputs with said second point, the voltage between said inputs being of one polarity before and during loading of the battery whenever the energy level of the battery is above the selected level, the voltage between said inputs being of an opposite polarity at least during loading of the battery whenever the energy level of the battery decreases to at least the selected level, an output from the operational amplifier providing said third signal whenever the voltage between said inputs is of said opposite polarity.

16. In a battery powered detecting device having supervision of the energy level of the battery, means for detecting the occurrence of a predetermined phenomenon and for generating a first voltage signal in response thereto; means for periodically loading the battery to subject it to a momentarily increased current flow; means for generating a second voltage signal; means for generating a third voltage signal having a magnitude substantially equal to the difference in output voltage of the battery from the condition prior to loading to during loading; means for comparing the magnitudes of said control and third signals and for generating a fourth voltage signal whenever their difference in magnitudes is at least equal to a predetermined value, said difference in magnitudes being equal to at least said predetermined value only when the energy level of the battery decreases to at least a selected level, and alarm means connected to receive said first and said fourth signals for generating sensually discernible indications representative thereof.

17. In a device as in claim 16, said difference in magnitude between said second and third voltage signals being at least equal to said predetermined value whenever the magnitude of said third voltage signal is at least equal to the magnitude to said second voltage signal.

18. In a device as in claim 17, said predetermined phenomenon being products of combustion.

19. In a device as in claim 17, including means for regulating said second voltage signal to a selected magnitude in the absence of said third voltage signal, and means for connecting said means for generating said third signal with said means for generating said second signal for decreasing the magnitude of said second signal by the magnitude of said third signal, said comprising the generating means providing said fourth signal whenever the magnitude of said second signal is decreased to at least zero.

20. In a device as in claim 17, said means for generating said second signal including a voltage divider, said second signal being generated between first and second points along said voltage divider, said means for generating said third signal including voltage transfer means for being connected between one output of the battery and said first point for transferring to said first point said third signal upon the battery output voltage changing with loading of the battery and for changing the voltage at said first point by the magnitude of said third signal and in a direction to decrease the voltage between said first and second points, said means for comparing and generating being connected with said first and second points for measuring the voltage therebetween and for generating said fourth signal whenever said voltage is decreased to at least zero, and including means for maintaining the voltage at said second point substantially constant during loading of the battery, whereby upon the battery energy level decreasing to at least the selected energy level said third signal decreases the voltage between said first and second points to at least zero to cause said comparing and generating means to generate said fourth signal.

21. In a device as in claim 20, said voltage transfer means comprising a capacitor for being connected between the one battery output and said first point.

22. In a device as in claim 20, said means for periodically loading said battery comprising an oscillator for being connected across the battery output for periodically momentarily establishing a relatively low impedance electrical circuit across the battery output.

23. In a device as in claim 20, said means for comparing and generating comprising an operational amplifier connected at inputs thereof across said first and second points, the voltage between said inputs being of one polarity prior to and during loading of the battery whenever the energy level thereof is above the selected level, the voltage between said inputs becoming of the opposite polarity at least during loading of the battery whenever the energy level thereof decreases to at least the selected level, said operational amplifier generating said fourth signal at an output therefrom whenever said voltage has said opposite polarity.

24. In a method of supervising the energy level of a battery, periodically loading the battery to subject the battery to a momentarily increased current flow; monitoring the change in voltage across the battery from the condition prior to loading to during loading, and generating a signal whenever the change in voltage is at least equal to a predetermined magnitude, the change in voltage being at least equal to the predetermined magnitude only whenever the energy level of the battery decreases to a selected level.

25. In a method of monitoring the energy level of a battery, periodically loading the battery to subject it to a momentarily increased current flow; generating a first voltage signal; generating a second voltage signal having a magnitude substantially equal to the magnitude of the change in output voltage of the battery from the condition prior to loading to the condition during loading, and comparing the magnitudes of the first and second signals and generating a third voltage signal whenever their difference in magnitudes is at least to a predetermined value, said difference being at least equal to said predetermined value whenever said energy level of said battery decreases to at least a selected level.

26. In a method as in claim 25, said comparing and generating step comprising comparing the magnitudes of said first and second signals and generating said third signal whenever the magnitude of the second signal is at least equal to the magnitude of the first signal.

27. In a method of monitoring the energy level of a battery, periodically loading the battery to subject it to a momentarily increased current flow; generating a first voltage signal; generating a second voltage signal having a magnitude substantially equal to the change in battery output voltage from the condition prior to loading to during loading; adding said second signal to said first signal to change the magnitude of said first signal by the magnitude of said second signal, and sensing the magnitude of said first signal and generating a third signal whenever the magnitude thereof has been changed by at least a predetermined amount, said magnitude of said first signal being changed by at least said predetermined amount whenever the energy level of the battery decreases to a selected level.

28. In a method as in claim 27, the step of adding said second signal to said first signal decreasing the magnitude of said first signal, and the step of sensing the magnitude of said first signal and generating said third signal including generating said third signal whenever the magnitude of said first signal is decreased to at least zero.

29. In a method as in claim 27, the step of periodically loading the battery comprising periodically connecting a relatively low impedance circuit across the battery.

30. In a method as in claim 27, the step of generating said first voltage signal comprising generating a first voltage signal having a predetermined value in the absence of said second voltage signal.

31. In a method as in claim 27, including the step of generating a sensible indication in response to generation of said third signal.

* * * * *